(12) United States Patent
Abdesselam

(10) Patent No.: US 11,757,372 B2
(45) Date of Patent: Sep. 12, 2023

(54) VOLTAGE MEASUREMENT DEVICE AND INVERTER DEVICE COMPRISING SUCH A VOLTAGE MEASUREMENT DEVICE

(71) Applicant: THALES, Courbevoie (FR)

(72) Inventor: Francis Abdesselam, Chatou (FR)

(73) Assignee: THALES, Courbevoie (FR)

( * ) Notice: Subject to any disclaimer, the term of this patent is extended or adjusted under 35 U.S.C. 154(b) by 157 days.

(21) Appl. No.: 17/549,482

(22) Filed: Dec. 13, 2021

(65) Prior Publication Data

US 2022/0190740 A1 Jun. 16, 2022

(30) Foreign Application Priority Data

Dec. 15, 2020 (FR) ...................................... 2013299

(51) Int. Cl.
*H02M 7/538* (2007.01)
*H02M 7/5387* (2007.01)
*G01R 19/00* (2006.01)

(52) U.S. Cl.
CPC ...... *H02M 7/5387* (2013.01); *G01R 19/0084* (2013.01)

(58) Field of Classification Search
CPC .. H02M 7/5387; G01R 19/0084; G01R 19/00
See application file for complete search history.

(56) References Cited

U.S. PATENT DOCUMENTS

| 6,341,076 B1* | 1/2002 | Kadatskyy ......... H03K 17/0814 363/56.09 |
|---|---|---|
| 2009/0243431 A1 | 10/2009 | Ohsawa |
| 2012/0068548 A1 | 3/2012 | Endo et al. |
| 2017/0097381 A1 | 4/2017 | Stephens et al. |
| 2018/0309383 A1* | 10/2018 | Wang .................. H02M 7/4837 |
| 2020/0052586 A1 | 2/2020 | Price et al. |

* cited by examiner

*Primary Examiner* — Adolf D Berhane
*Assistant Examiner* — Afework S Demisse
(74) *Attorney, Agent, or Firm* — BakerHostetler

(57) ABSTRACT

A measurement device configured to deliver a voltage corresponding to an overlay of an input voltage applied to the terminals of the measurement device and of an image voltage of a current circulating in a first capacitor to the terminals of which the input voltage is applied, the measurement device includes a shunt filter intended to be mounted in parallel with the first capacitor and comprising a second capacitor and a first resistor mounted in series with the second capacitor, a second resistor mounted in parallel with the second capacitor.

4 Claims, 2 Drawing Sheets

VOLTAGE MEASUREMENT DEVICE AND INVERTER DEVICE COMPRISING SUCH A VOLTAGE MEASUREMENT DEVICE

CROSS-REFERENCE TO RELATED APPLICATIONS

This application claims priority to foreign French patent application No. FR 2013299, filed on Dec. 15, 2020, the disclosure of which is incorporated by reference in its entirety.

FIELD OF THE INVENTION

The invention falls within the area of current and voltage measurement.

It is notably applicable in the regulation of voltages by means of power switches.

It is for example applicable in the control of a voltage inverter for regulating the output voltage of the inverter, for example by pulse-width modulation or by hysteresis PWM.

Such an inverter OM is represented in FIG. 1. This inverter OM comprises four controllable power switches T1, T2, T3, T4 mounted in H-bridge configuration. The H-bridge comprises two branches B1 and B2 each comprising two switches connected in series. The first branch B1 comprises a first switch T1 and a second switch T2 linked in series via a first point P1, called first mid-point. The second branch B2 comprises a third switch T3 and a fourth switch T4 linked in series via a second point P2, called second mid-point. The inverter OM is provided with an output low-pass filter linking the mid-points P1 and P2 to one another. The output filter comprises an output inductor L mounted in series with a capacitor C.

When the inverter is controlled for the power supply voltage of a load Z mounted in parallel with the capacitor C to be the reference sinusoidal voltage, the voltage at the terminals of the capacitor C is a low-frequency sinusoid and the current circulating in the capacitor C is a triangular current whose frequency is the switching frequency of the switches which is high compared to that of the voltage.

In order to regulate the voltage delivered by the inverter OM, that is to say to control the power switches of the inverter OM for it to power the load Z with a reference sinusoidal voltage, it is necessary to have a measurement corresponding to a weighted sum of the voltage at the terminals of the capacitor and of an image voltage of the current circulating in the capacitor.

Conventionally, the output voltage delivered by the inverter OM is measured by voltage measurement means, for example, by means of resistors, and the current is measured by a current transformer composed of a primary winding, a secondary winding, a magnetic circuit and a low-impedance load in series with the secondary winding making it possible to measure the current circulating in the primary winding with a transformation ratio. The current and voltage measurements are then summed with weighting through a summing amplifier.

BACKGROUND

One aim of the present invention is to propose a simplified solution.

To this end, the subject of the invention is a measurement device configured to deliver a voltage corresponding to an overlay of an input voltage applied to the terminals of the measurement device and of an image voltage of a current circulating in a first capacitor to the terminals of which the input voltage is applied, the measurement device comprising a shunt filter intended to be mounted in parallel with the first capacitor and comprising:

a second capacitor and a first resistor mounted in series with the second capacitor, a second resistor mounted in parallel with the second capacitor.

In a particular embodiment, the measurement device comprises the first capacitor.

Advantageously, the shunt filter has a time constant less than ten times a predetermined maximum period of the input current.

The invention relates also to an inverter device intended to transform a direct voltage into a single-phase voltage, the inverter device comprising a low-pass filter comprising a first capacitor and an inductor, the measurement device and four power switches mounted in H-bridge configuration comprising two branches each comprising two switches connected in series, a first mid-point linking the two switches of a first of the two branches and a second mid-point linking the two switches of a second of the two branches, the first mid-point being linked to a first terminal of the first capacitor via the inductor and the second mid-point being linked to a second terminal of the second capacitor.

The inverter device advantageously comprises a regulator configured to control the switches as a function of the voltage delivered at the terminals of the first resistor.

BRIEF DESCRIPTION OF THE DRAWINGS

Other features, details and advantages of the invention will emerge on reading the description given with reference to the attached drawings given by way of example and which represent, respectively.

From one figure to another, the same elements are identified by the same references.

DETAILED DESCRIPTION

The invention relates to a measurement device that makes it possible to deliver a voltage corresponding to an overlay of a voltage applied to its terminals and of an image voltage of a current powering a first capacitor.

This measurement device makes it possible, notably, to deliver a voltage corresponding to a weighted sum of a sinusoidal voltage applied to its terminals and of an image voltage of an alternating current, for example triangular, powering the first capacitor and having a very high frequency compared to the frequency of the voltage applied to the terminals of the measurement device, that is to say greater than ten times the frequency of the voltage applied to its terminals.

Image voltage of a current is understood to mean a voltage exhibiting the same form, phase and frequency as the current.

This measurement device is useful in providing a measurement used to regulate a voltage of any form and frequency by means of power switches.

This measurement device is useful, for example, in providing control to control the power switches of a voltage inverter so as to regulate the voltage delivered by that inverter at the terminals of the first capacitor on a reference sinusoidal voltage, for example by hysteresis PWM.

Figure 1:
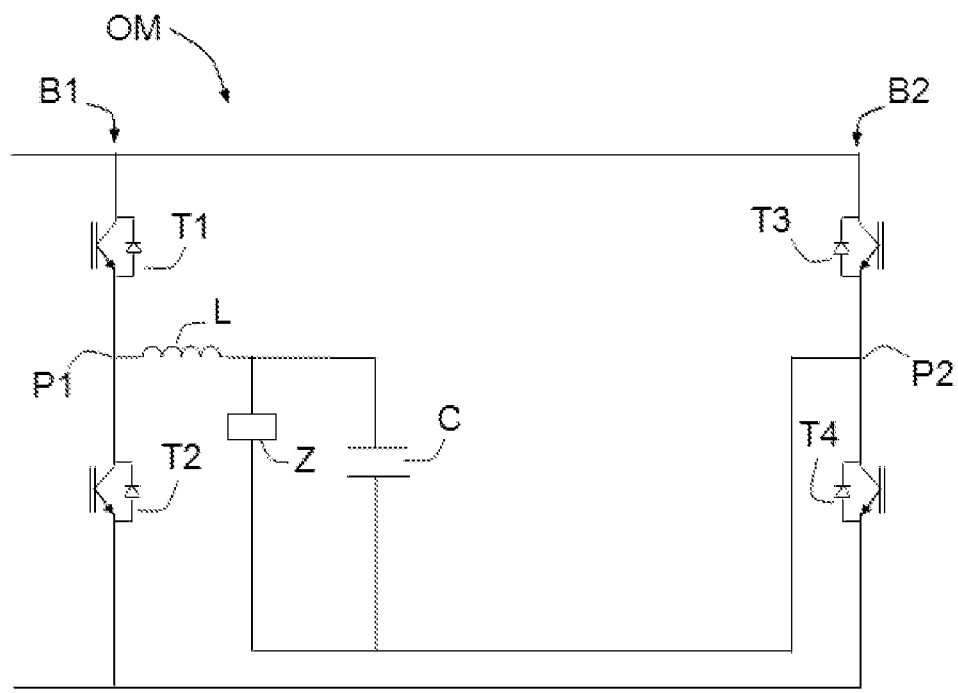
FIG. 1 is an illustration of an inverter provided with an output filter and powering a load.
Figure 2:
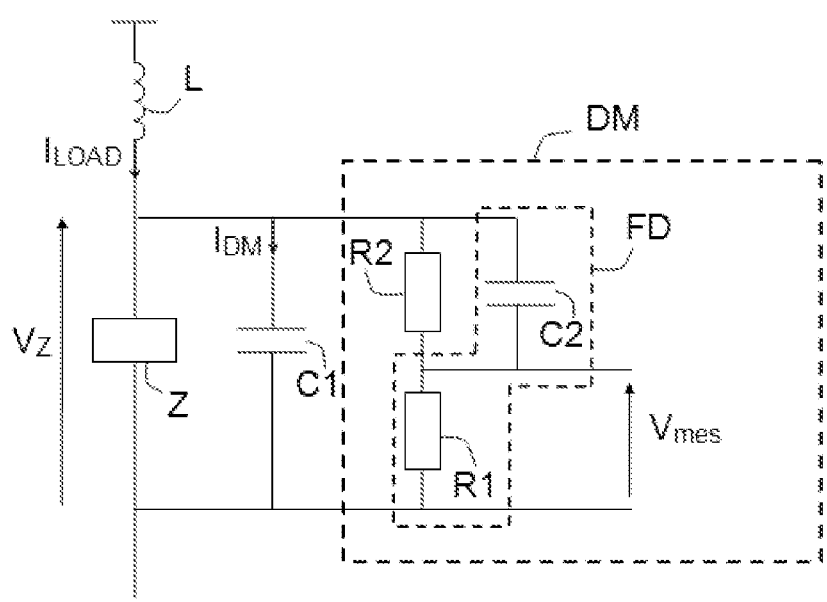
FIG. 2 is an illustration of a measurement device according to the invention.

The measurement device DM according to the invention is represented in FIG. 2. In this figure, the measurement device DM is mounted in parallel with a user impedance Z of impedance value z that can, for example, be inductive, capacitive or resistive powered by a voltage $V_z$, for example an output voltage of an inverter.

The measurement device is mounted in parallel with the first capacitor C1 of first capacitance c1.

The first capacitor is linked to an inductor L. The capacitor and the inductor form an LC circuit called LC1 hereinbelow in the text.

The current $I_{DM}$ is the alternating part of the current $I_{LOAD}$ circulating in the inductor.

Advantageously, the first capacitance c1 is such that the product of the value of the inductor L and the first capacitance c1 is less than ten times a maximum period $T_{AC}$ of the alternating part of the current intended to circulate in the first capacitor C1, that is to say the maximum period $T_{AC}$ of the current intended to circulate in the first capacitor C1.

In other words, the minimum frequency of the alternating part of the current intended to circulate in the inductor L is very much greater than the resonance frequency of the circuit LC1 which makes it possible to obtain a current of low amplitude in the capacitor C1.

The measurement device DM comprises a shunt filter FD mounted in parallel with the first capacitor C1 comprising a second capacitor C2 and a first resistor R1 mounted in series with the second capacitor C2.

The shunt filter FD has a time constant less than ten times a maximum period $T_{AC}$ of the alternating part of the current intended to circulate in the inductor L. In other words, the time constant of the shunt filter is less than ten times the maximum period $T_{AC}$ of the current intended to circulate in the inductor L.

The time constant TF of the shunt filter FD is given by:

$$TF = r1 * c2.$$

In which r1 is the value of the first resistor R1 and c2 is the capacitance of the second capacitor C2.

The measurement device DM further comprises a second resistor R2 of value r2 mounted in parallel with the second capacitor C2 such that the first resistor R1 and the second resistor R2 form a voltage divider.

The shunt filter FD makes it possible to obtain, at the output of the shunt filter FD, a voltage which is an image of a derivative of the voltage applied to the terminals of the shunt filter FD which is the voltage applied to the terminals of the first capacitor. This voltage is therefore the image of the current $I_{DM}$ circulating in the first capacitor C1.

The voltage divider makes it possible to divide the voltage applied at the input of the first capacitor C1 which is the input voltage of the measurement device DM.

Thus, the voltage $V_{mes}$ delivered at the output of the measurement device DM, that is to say the voltage at the terminals of the first resistor R1, is a weighted sum of an image voltage of the power supply current $I_{DM}$ of the measurement device DM, that is to say of the current circulating in the first capacitor C1 (this image voltage is obtained by the shunt filter) and of the voltage applied to the terminals of the measurement device $V_z$, that is to say the voltage applied at the terminals of the first capacitor C1 (obtained by the voltage divider).

The totality of the variations of the current $I_{LOAD}$ circulates in the capacitor C1. Consequently, by shunting the voltage at the terminals of the capacitor, an image of the variations of the current circulating in $I_{LOAD}$ is obtained.

The voltage $V_{mes}$ measured at the terminals of the first resistor R1 is therefore given by:

$$V_{mes} = \frac{r1 * c2}{c1} * I_{DM} + \frac{r1}{r1 + r2} * V_z$$

In which $V_z$ which is the voltage applied to the input terminals of the measurement device DM is also the voltage measured at the terminals of the user impedance Z which is, for example, the output voltage of a voltage inverter.

Figure 3:
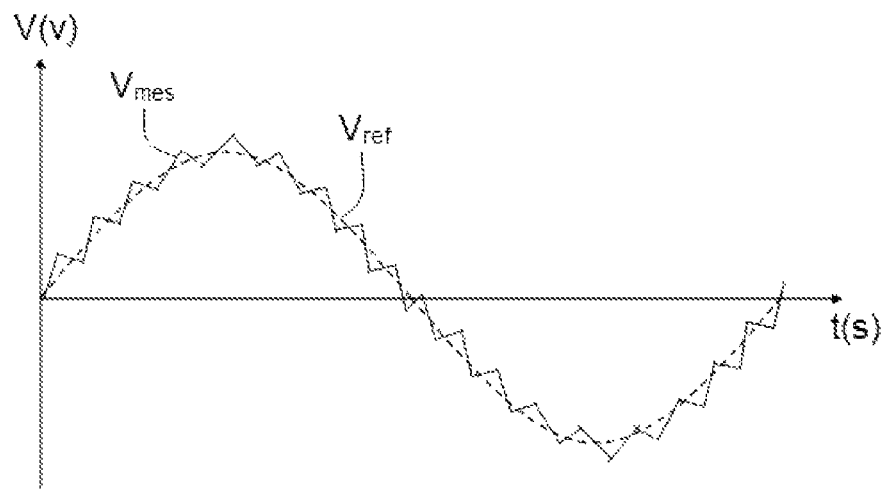
FIG. 3 is an illustration of a measurement obtained from a measurement device according to the invention.

An example of voltage $V_{mes}$ measured at the terminals of the first resistor R1 is represented in FIG. 3 by solid lines, in the case where the measurement device is connected at the output of a voltage inverter. The reference voltage desired at the output of the capacitor $V_{ref}$ is a sinusoidal voltage represented by dotted lines. The voltage $V_{mes}$ is substantially the overlay of a sinusoidal voltage $V_{ref}$ and of a triangular alternating voltage as the image of the power supply current of the first capacitor.

The measurement device offers the advantage of comprising only passive components. It is simple, inexpensive and is of relatively low weight. That allows it to be easily incorporated in an inverter device, for example, to ensure the regulation of a low-power or high-power voltage inverter.

Moreover, this measurement device DM offers the advantage of having no magnetic element. That makes it possible to avoid the problems linked to the saturation of the magnetic material, notably the non-linearity of the measurement.

The invention relates also to an inverter device comprising a single-phase inverter intended to transform a direct voltage into a single-phase voltage.

Figure 4:
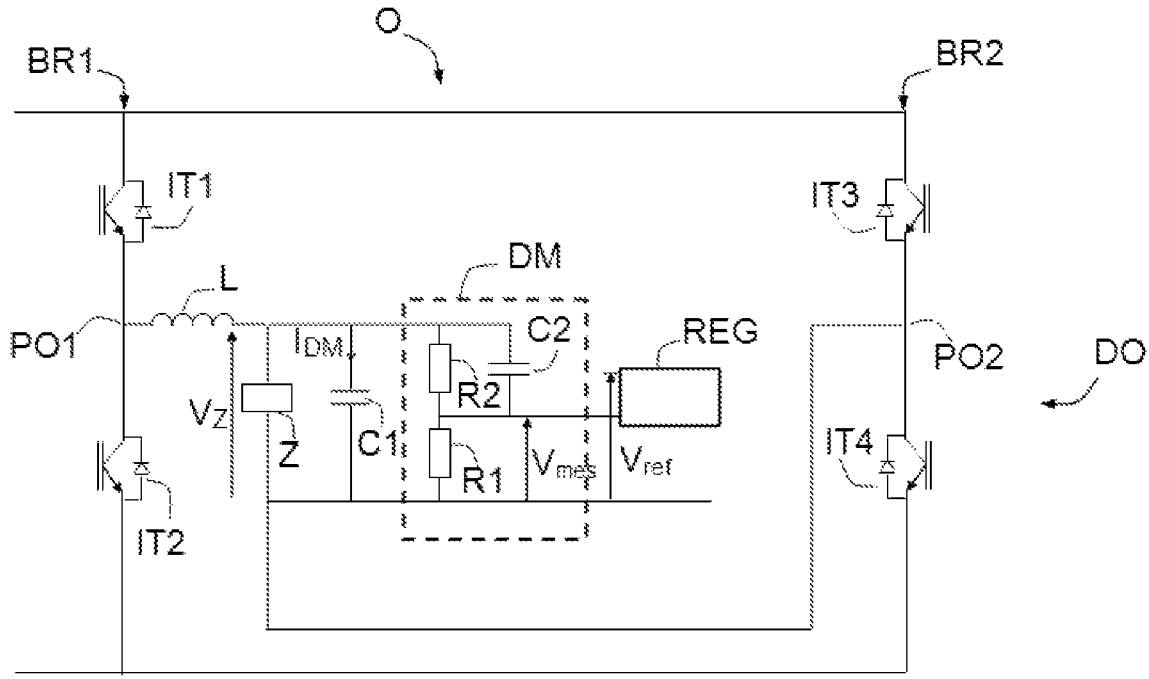
FIG. 4 is an illustration of an inverter device according to the invention comprising an inverter and a measurement device according to the invention.

An example of such an inverter device DO according to the invention is shown in FIG. 4.

The inverter O comprises four controllable power switches IT1, IT2, IT3, IT4 mounted in H-bridge configuration. The H bridge comprises two branches BR1 and BR2 each comprising two switches connected in series. The first branch BR1 comprises a first switch IT1 and a second switch IT2 linked in series via a first point PO1, called first mid-point. The second branch BR comprises a third switch IT3 and a fourth switch IT4 linked in series via a second point PO2, called second mid-point.

The inverter O also comprises an output low-pass filter formed by the first capacitor C1 and the inductor L. Voltage inverters usually comprise this type of low-pass filter.

The first capacitor C1 makes it possible to eliminate the direct component of the voltage and the inductor L makes it possible to control the level and the variations of the current $I_{LOAD}$ circulating in the line comprising the inductor.

The first mid-point PO1 is linked to a first terminal of the first capacitor C1 via the inductor L and the second mid-point PO2 is linked to a second terminal of the first capacitor C1.

The period $T_{AC}$ cited above is the switching period of the switches. The period of the alternating part of the current circulating in the inductor L is equal to the switching period of the switches.

The output voltage of the inverter O is the voltage at the terminals of the first capacitor C1.

The user impedance Z is mounted in parallel with the first capacitor C1.

The inverter device DO also comprises a measurement device DM as represented in FIG. 2.

The measurement device DM according to the invention offers the advantage of making use of the first capacitor C1 usually present in the voltage inverters, to deliver the desired measurement.

As a variant, the measurement device DM comprises the first capacitor C1.

That makes it possible to make use of the measurement device DM according to the invention on a current inverter usually without such an output capacitor C1.

Advantageously, the inverter device DO comprises a regulator REG configured to control the power switches IT1 to IT4 from the voltage $V_{mes}$ at the terminals of the first resistor R1 and the reference sinusoidal voltage $V_{ref}$.

The reference voltage $V_{ref}$ is, for example, the desired power supply voltage of the user impedance.

The regulator REG is advantageously configured to control the power switches IT1 to IT4 from the voltage at the terminals of the first resistor $V_{mes}$ and the reference sinusoidal voltage $V_{ref}$ such that the power supply voltage of the measurement device DM or power supply voltage of the user impedance Z is substantially equal to the reference voltage $V_{ref}$.

The regulator REG is advantageously configured to control the controllable switches by pulse width modulation (PWM), for example hysteresis PWM or another type of control by PWM.

The regulator REG is configured to deliver controls that switch the switches at a switching frequency Fd with a duty cycle Rc defined from the voltage $V_{mes}$ and the reference voltage $V_{ref}$.

The inverter device can comprise several single-phase inverters as represented in FIG. 4, mounted in parallel, each being associated with a measurement device according to the invention and with a control device. The different inverters are associated with distinct measurement devices and with distinct control devices.

The control devices are advantageously configured to control the controllable electronic switches of the inverters such that each inverter delivers one of the phases of a three-phase alternating voltage of fixed frequency and the three inverters deliver the three phases of the three-phase voltage. This type of control is conventional to the person skilled in the art.

The control device is, for example, configured so that each inverter supplies a 400 Hz alternating voltage of 300 V root mean square voltage, the three alternating voltages being phase-shifted so as to form the phases of a three-phase alternating voltage, from a direct voltage of 540 V.

This configuration makes it possible to offer a partial availability of the inverter device DO in the event of failure of one of the inverters.

The regulator can comprise one or more dedicated electronic circuits or a general-purpose circuit.

The regulator REG advantageously comprises analogue means, such as, for example, at least one comparator and/or at least one amplifier and/or at least one logic gate.

As a variant, the regulator comprises a reprogrammable computation machine (a processor or a microcontroller for example) and/or a computer running a programme comprising a sequence of instructions and/or a dedicated computation machine (for example a set of logic gates such as an FPGA, a DSP or an ASIC, or any other hardware module) and/or analogue components.

The regulator REG comprises, for example, one or more driver devices to control the successive switchings of each of the switches.

The invention claimed is:

1. An inverter device (DO) intended to transform a direct voltage into a single-phase voltage, the inverter device (DO) comprising a low-pass filter, a measurement device (DM), and four power switches mounted in H-bridge configuration, said low-pass filter comprising the first capacitor (C1) and an inductor (L), said measurement device (DM) being configured to deliver a voltage corresponding to an overlay of an input voltage applied to the terminals of the measurement device (DM) and of an image voltage of a current circulating in a first capacitor (C1) to the terminals of which the input voltage is applied, the measurement device (DM) comprising:
    a shunt filter (FD) intended to be mounted in parallel with the first capacitor (C1) and comprising a second capacitor (C2) and a first resistor (R1) mounted in series with the second capacitor (C2),
    a second resistor (R2) mounted in parallel with the second capacitor (C2);
said H-bridge comprising two branches each comprising two switches connected in series, a first mid-point (P1) linking the two switches of a first of the two branches and a second mid-point (P2) linking the two switches of a second of the two branches, the first mid-point (P1) being linked to a first terminal of the first capacitor (C1) via the inductor (L) and the second mid-point (P2) being linked to a second terminal of the second capacitor (C2).

2. The inverter device (DO) according to claim 1, wherein the measurement device (DM) comprises the first capacitor (C1).

3. The inverter device (DO) according to claim 1, wherein the shunt filter (FD) has a time constant less than ten times a predetermined maximum period of the input current.

4. The inverter device (DO) according to claim 3, comprising a regulator (REG) configured to control the switches as a function of the voltage delivered at the terminals of the first resistor (R1).

* * * * *